United States Patent
Reisbick et al.

(10) Patent No.: US 11,315,416 B2
(45) Date of Patent: *Apr. 26, 2022

(54) PARKING SENSOR MAGNETOMETER CALIBRATION

(71) Applicant: Parkifi, Inc., Englewood, CO (US)

(72) Inventors: Richard Reisbick, Westminster, CO (US); Ryan Sullivan, San Francisco, CA (US)

(73) Assignee: Parkifi, Inc., Englewood, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/075,023

(22) Filed: Oct. 20, 2020

(65) Prior Publication Data

US 2021/0035445 A1 Feb. 4, 2021

Related U.S. Application Data

(63) Continuation of application No. 16/528,105, filed on Jul. 31, 2019, now Pat. No. 10,847,028.

(60) Provisional application No. 62/713,346, filed on Aug. 1, 2018.

(51) Int. Cl.
*G08G 1/042* (2006.01)
*G08G 1/14* (2006.01)

(52) U.S. Cl.
CPC .............. *G08G 1/042* (2013.01); *G08G 1/141* (2013.01)

(58) Field of Classification Search
CPC ........ G08G 1/042; G08G 1/048; G08G 1/145; G01G 1/141; G01V 3/08; G01R 33/02
See application file for complete search history.

(56) References Cited

U.S. PATENT DOCUMENTS

| | | | | |
|---|---|---|---|---|
| 4,361,202 A | * | 11/1982 | Minovitch | B60K 31/0008 104/88.02 |
| 6,304,083 B1 | * | 10/2001 | Owens | G11B 5/3903 324/258 |
| 8,102,799 B2 | | 1/2012 | Alexander et al. | |
| 8,577,640 B2 | * | 11/2013 | Keal | G01R 33/02 702/104 |
| 8,816,879 B2 | | 8/2014 | Stefik et al. | |
| 8,823,520 B2 | | 9/2014 | Ly et al. | |
| 9,151,610 B2 | * | 10/2015 | Chow | G01R 33/02 |

(Continued)

FOREIGN PATENT DOCUMENTS

| | | |
|---|---|---|
| WO | 03029046 | 4/2003 |
| WO | 2009079779 | 7/2009 |
| WO | 2017107123 | 6/2017 |

OTHER PUBLICATIONS

International Preliminary Report on Patentability for PCT/US2018/052430, dated May 7, 2020, 10 pages.

(Continued)

*Primary Examiner* — Ojiako K Nwugo
(74) *Attorney, Agent, or Firm* — Kilpatrick Townsend & Stockton LLP (57) ABSTRACT

Various arrangements for determining that a vehicle is present in a parking space are presented. A parking sensor can make a plurality of magnetic field strength measurements using a magnetometer. A determination that the vehicle is parked proximate to the parking sensor device within the parking space can be based on a magnetic field strength measurement in relation to the selected magnetic field strength window.

19 Claims, 8 Drawing Sheets

(56) References Cited

U.S. PATENT DOCUMENTS

| | | |
|---|---|---|
| 10,104,454 B2 | 10/2018 | Sullivan |
| 10,459,103 B1* | 10/2019 | Shi .................. G01V 8/10 |
| 10,506,309 B2 | 12/2019 | Sullivan et al. |
| 10,691,954 B2 | 6/2020 | Beals et al. |
| 10,847,028 B2 | 11/2020 | Reisbick et al. |
| 10,991,249 B2 | 4/2021 | Reisbeck et al. |
| 2002/0027499 A1 | 3/2002 | Chainer et al. |
| 2005/0280555 A1 | 12/2005 | Warner, IV |
| 2006/0136131 A1 | 6/2006 | Dugan et al. |
| 2007/0050240 A1* | 3/2007 | Belani .................. G08G 1/14 705/13 |
| 2008/0129544 A1 | 6/2008 | Augst |
| 2008/0274766 A1 | 11/2008 | Pratt et al. |
| 2008/0294020 A1 | 11/2008 | Sapounas |
| 2009/0273340 A1* | 11/2009 | Stephanson .......... G01R 33/02 324/202 |
| 2011/0163894 A1 | 7/2011 | Grievink et al. |
| 2011/0199077 A1* | 8/2011 | Bergstrom ........... G08G 1/142 324/244 |
| 2011/0218940 A1* | 9/2011 | Bergstrom ........... G07B 15/02 705/418 |
| 2013/0027218 A1* | 1/2013 | Schwarz ............. G08G 1/017 340/870.02 |
| 2013/0073350 A1 | 3/2013 | Blustein |
| 2013/0311140 A1 | 11/2013 | Schechter |
| 2014/0021947 A1* | 1/2014 | Gmajnic .............. G08G 1/042 324/252 |
| 2014/0072178 A1 | 3/2014 | Carbonell et al. |
| 2014/0112101 A1* | 4/2014 | Rodrich ................ G08G 1/14 367/93 |
| 2014/0277691 A1* | 9/2014 | Jacobus ............... B66F 9/063 700/216 |
| 2014/0340240 A1* | 11/2014 | Becker ................. G01S 13/91 340/932.2 |
| 2014/0343891 A1* | 11/2014 | Becker ................. G08G 1/04 702/150 |
| 2015/0051806 A1* | 2/2015 | Kimiagar .............. B60T 7/126 701/93 |
| 2015/0222859 A1* | 8/2015 | Schweid ........... G06K 9/00624 348/148 |
| 2015/0310745 A1 | 10/2015 | Osment |
| 2015/0369618 A1 | 12/2015 | Barnard et al. |
| 2015/0381737 A1 | 12/2015 | Quinn et al. |
| 2016/0292808 A1 | 10/2016 | Blandin et al. |
| 2016/0298950 A1* | 10/2016 | Modi .................... G08B 29/22 |
| 2017/0025008 A1 | 1/2017 | Gignac et al. |
| 2017/0092130 A1 | 3/2017 | Bostick et al. |
| 2017/0098374 A1* | 4/2017 | Sullivan ............... H04W 4/44 |
| 2017/0129483 A1 | 5/2017 | Li et al. |
| 2017/0134536 A1 | 5/2017 | Tessiore et al. |
| 2017/0140645 A1* | 5/2017 | Balid .................... H04W 4/40 |
| 2017/0148230 A1 | 5/2017 | Richard |
| 2017/0191849 A1* | 7/2017 | Agam ................. G08G 1/0112 |
| 2017/0361726 A1* | 12/2017 | Widmer ................ G01S 19/42 |
| 2018/0066944 A1* | 3/2018 | Shu ..................... G01C 21/206 |
| 2018/0198641 A1 | 7/2018 | Gilani et al. |
| 2018/0247534 A1* | 8/2018 | Williams ............... G08G 1/142 |
| 2018/0286237 A1 | 10/2018 | Hu et al. |
| 2018/0351761 A1 | 12/2018 | Li et al. |
| 2019/0014392 A1 | 1/2019 | Sullivan et al. |
| 2019/0122050 A1 | 4/2019 | Beals et al. |

OTHER PUBLICATIONS

International Search Report and Written Opinion for PCT/US2018/052430, dated Jan. 15, 2019, 13 pages.
International Search Report and Written Opinion for PCT/US2019/044593, dated Oct. 23, 2019, 10 pages.
International Search Report and Written Opinion for PCT/US2019/063529, dated Feb. 21, 2020, 14 pages.
International Search Report and Written Opinion for PCT/US2019/063847, dated Feb. 25, 2020, 13 pages.
International Preliminary Report on Patentability for PCT/US2019/044593 dated Feb. 2, 2021, all pages.

* cited by examiner

PARKING SENSOR MAGNETOMETER CALIBRATION

CROSS REFERENCES TO RELATED APPLICATIONS

This Application is a continuation of U.S. patent application Ser. No. 16/528,105, filed on Jul. 31, 2019, entitled "Parking Sensor Magnetometer Calibration," which application claims priority to U.S. Provisional Patent Application No. 62/713,346, entitled "Parking Sensor Magnetometer Calibration," filed on Aug. 1, 2018, the entire disclosure of which is hereby incorporated by reference for all purposes.

BACKGROUND

Detecting metallic objects using magnetometers has certain advantages: magnetometers use little power and can be fit in a relatively small device. However, over time, magnetometers tend to drift out of calibration. Without occasional recalibration, measurements made by a magnetometer cannot be relied on to accurately detect whether a vehicle is present within a parking space.

SUMMARY

Various embodiments are described related to a method for determining that a vehicle is present in a parking space. In some embodiments, a method for determining that a vehicle is present in a parking space is described. The method may include measuring, by a parking sensor device, a plurality of magnetic field strength measurements using a magnetometer. The method may include storing the plurality of magnetic field strength measurements. The method may include evaluating the plurality of magnetic field strength measurements to determine a number of the plurality of magnetic field strength measurements that may be within each magnetic field strength window of a plurality of magnetic field strength windows. Each magnetic field strength window may define a different range of magnetic field strengths. The method may include selecting a magnetic field strength window as a vehicle-detection baseline based upon a greatest number of magnetic field strength measurements of the plurality of magnetic field strength measurements being evaluated to be within the magnetic field strength window. The method may include determining that the vehicle may be parked proximate to the parking sensor device within the parking space at least partially based on a magnetic field strength measurement being outside of the selected magnetic field strength window.

Embodiments of such a method may include one or more of the following features: selecting a parking space profile from a plurality of parking space profiles. Each parking space profile may be configured for a different parking space usage pattern. The plurality of magnetic field strength measurements may include magnetic field strength measurements stored in response to a change in magnetic field strength detected by the parking sensor device. The selected parking space profile may be used to determine when the plurality of magnetic field strength measurements may be made. The plurality of magnetic field strength measurements may include magnetic field strength measurements stored in response to a threshold period of time having elapsed during which no magnetic field strength measurement may have been stored. The selected parking space profile may be used to determine when the plurality of magnetic field strength measurements may be made. Evaluating the plurality of magnetic field strength measurements, selecting the magnetic field strength window, and determining whether the vehicle may be parked proximate to the parking sensor device may each be performed by the magnetometer. The method may further include transmitting, by the parking sensor device, an indication that the parking space may be occupied by the vehicle in response to determining that the vehicle may be parked proximate to the parking sensor device based on the magnetic field strength measurement being outside of the selected magnetic field strength window. Evaluating the plurality of magnetic field strength measurements, selecting the magnetic field strength window, and determining whether the vehicle may be parked proximate to the parking sensor device may each be performed by a parking sensor gateway system. The parking sensor device may be positioned on the ground within the parking space such that a magnetic field strength may be measured for a region above the parking sensor device. The method may further include receiving, by a parking sensor gateway, the plurality of magnetic field strength measurements. The method may further include receiving, by the parking sensor gateway, a second plurality of magnetic field strength measurements for a second parking space adjacent to the parking space. Determining the vehicle may be parked proximate to the parking sensor device may be at least partially based on the second plurality of magnetic field strength measurements. The method may further include performing, by the parking sensor device, a time-of-flight measurement. The method may further include determining that the vehicle may be parked proximate to the parking sensor device within the parking space at least partially based on the time-of-flight measurement. Performing the time-of-flight measurement may be performed in response to determining that an insufficient amount of confidence may be present of whether the vehicle may be present.

In some embodiments, a parking system for determining that a vehicle may be present in a parking space is described. The system may include a parking space sensor device comprising a wireless communication interface and a magnetometer. The parking space sensor may be configured to be installed within the parking space and may be configured to measure a plurality of magnetic field strength measurements using the magnetometer. The system may include a computerized system remote from the parking space sensor that may be in communication with the parking space sensor via the wireless communication interface. The system may be configured to store the plurality of magnetic field strength measurements. The system may be configured to evaluate the plurality of magnetic field strength measurements to determine a number of the plurality of magnetic field strength measurements that may be within each magnetic field strength window of a plurality of magnetic field strength windows. Each magnetic field strength window may define a different range of magnetic field strengths. The system may be configured to select a magnetic field strength window as a vehicle-detection baseline based upon a greatest number of magnetic field strength measurements of the plurality of magnetic field strength measurements being evaluated to be within the magnetic field strength window. The system may be configured to determine that the vehicle may be parked proximate to the parking space sensor device within the parking space at least partially based on a magnetic field strength measurement being outside of the selected magnetic field strength window.

Embodiments of such a system may include one or more of the following features: the computerized system may be a parking sensor gateway that communicates wirelessly with a plurality of parking sensor devices. The plurality of parking sensor devices may include the parking sensor device. The computerized system may be a parking host system that communicates with the parking sensor device via a parking sensor gateway. The parking host system may use a narrow-band Internet-of-Things (NB-IoT) wireless network to communicate with the parking sensor gateway. The parking sensor device may further include a time-of-flight sensor that detects whether a vehicle may be parking within the parking space. The parking system may be further configured to determine that the vehicle parked proximate to the parking sensor device within the parking space at least partially based on one or more measurements from the time-of-flight sensor. The parking system may be further configured to select a parking space profile from a plurality of parking space profiles. Each parking space profile may be configured for a different parking space usage pattern. Based on the selected parking space profile, a magnetic field strength measurement may be only stored in response to a change in magnetic field strength being detected by the parking sensor device. Based on the selected parking space profile, the plurality of magnetic field strength measurements comprises magnetic field strength measurements stored in response to a threshold period of time having elapsed during which no magnetic field strength measurement has been stored.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

While magnetometers may use a relatively small amount of power to perform a measurement and can accurately determine whether a metallic object, such as a vehicle (e.g., car, truck, sport utility vehicle, motorcycle, etc.) is nearby, over time, magnetometers tend to drift out of calibration. Therefore, a calibration process may have to be performed occasionally or periodically. One possible calibration process could include using the magnetometer to make a measurement when it is known that a vehicle is not present. However, such a measurement may require human involvement to confirm that a vehicle or other metallic object is not nearby the magnetometer when the recalibration measurement is made. Rather, it may be desirable for a device that has a magnetometer onboard, such as a parking sensor device, to be able to periodically or occasionally perform a recalibration without requiring outside confirmation of whether a vehicle or other large metallic object is located nearby. For instance, parking sensor devices may be installed in each of a large number of parking spaces, such as parking spaces in a parking garage, in a parking lot, on a street, or at an airport parking facility. Such locations can involve hundreds or thousands of parking spaces. It may be time-consuming and inefficient for a person to be involved in periodically recalibrating each parking sensor device located in parking spaces in such locations.

Embodiments detailed herein are focused on a low-power parking sensor device that is able to recalibrate such that measurements made by an onboard magnetometer can be used to accurately determine whether a vehicle is parked in a corresponding parking space. By analyzing the number of magnetic field strength measurements made by the magnetometer within multiple defined magnetic field strength ranges, a particular range can be selected as a baseline range, wherein magnetic field strength measurements within the baseline range are considered indicative of no vehicle being present. Such a determination may be performed periodically or occasionally, such as once per day or, possibly, after each new magnetometer reading is made. Further, a parking sensor gateway may be able to use data obtained from multiple parking sensor devices in order to more accurately determine whether a parking space is occupied, such as if the data obtained from a particular parking sensor is inconclusive. Additionally or alternatively, the parking sensor device may have a time-of-flight (ToF) sensor onboard that may be used to confirm or determine whether a parking space is occupied by a vehicle if data obtained from the magnetometer is inconclusive. It may be preferable to rely on the magnetometer for the majority of measurements due to the magnetometer requiring less power to operate than a ToF sensor. Such parking sensor devices may be powered by one or more onboard batteries; therefore, by limiting the amount of power used, the one or more batteries may need to be replaced or recharged less often.

Figure 1:
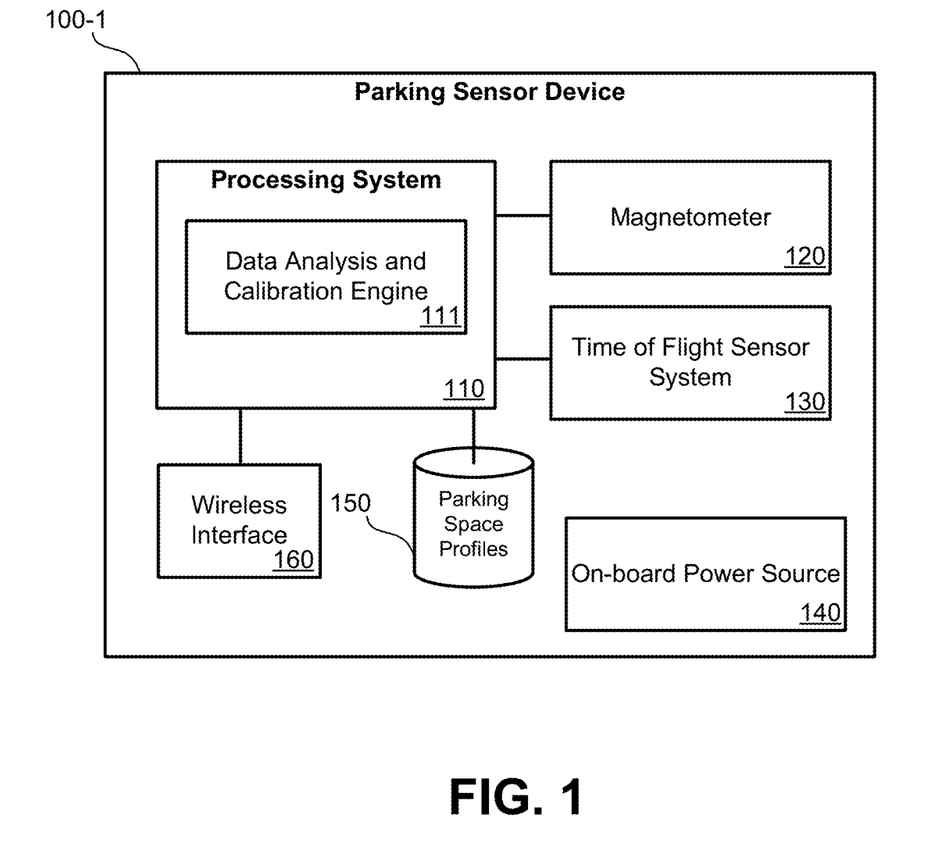
FIG. 1 illustrates an embodiment of a parking sensor device.

FIG. 1 illustrates an embodiment of a parking sensor device 100-1. Parking sensor device 100-1 may include: processing system 110, magnetometer 120; ToF sensor system 130; onboard power source 140; parking space profiles data store 150; and wireless interface 160. Processing system 110 may include one or more general-purpose or special-purpose processors that are either programmed to perform various calculations or execute instructions that may be stored on a non-transitory processor readable medium, such as random-access memory, solid-state drive, or hard drive. In some embodiments, one or more ASICs (application-specific integrated circuits) may be used to perform the functions of the one or more processors. In some embodiments, one or more FPGAs may be used to perform the functions of the one or more processors.

Parking sensor device 100-1 may have one or more magnetometers, such as magnetometer 120. Magnetometer 120 may measure the strength and, possibly, direction of a magnetic field located nearby parking sensor device 100-1. Parking sensor device 100-1 may be designed to be attached to the ground within a parking space such that magnetometer 120 measures a magnetic field that is affected by whether or not a vehicle is present above parking sensor device 100-1 within a parking space. In other embodiments, parking sensor device 100-1 may be located within or nearby a parking space and may determine whether a vehicle is present in a direction other than above parking sensor device 100-1. Further detail regarding the location and physical exterior design of a possible embodiment of parking sensor device 100-1 is provided in U.S. patent application Ser. No. 15/286,429, filed Oct. 5, 2016, entitled "Parking Data Aggregation and Distribution," the entire disclosure of which is hereby incorporated by reference for all purposes. Magnetometer 120 may periodically make magnetic field strength measurements and output data indicative of such measurements to processing system 110.

ToF sensor system 130 may admit electromagnetic radiation at a particular frequency in response to a request to make a distance measurement from processing system 110. ToF sensor system 130 may use significantly more power than magnetometer 120; therefore, ToF sensor system 130 may only be used to make a distance measurement when data received from magnetometer 120 is inconclusive as to whether a vehicle is parked above or otherwise proximate to parking sensor device 100-1. ToF sensor system 130 may transmit EM radiation at approximately 915 MHz. ToF sensor system 130 may measure a difference in phase between the EM radiation emitted and a reflected portion of the EM radiation received back. Based on this difference in phase, a distance between parking sensor device 100-1 and a surface that reflected the EM radiation may be determined.

Onboard power source 140 may include a battery interface and one or more batteries and/or capacitors. Parking sensor device 100-1 may be powered exclusively by power from such one or more batteries. Therefore, in order to limit the frequency at which the one or more batteries need to be recharged or replaced, parking sensor device 100-1 may be configured to conserve power. In order to determine whether a vehicle is parked above or otherwise proximate to parking sensor device 100-1, measurements made by magnetometer 120 may be used. If such measurements are inconclusive, one or more other measures may be taken, such as using ToF sensor system 130 in order to determine the distance between parking sensor device 100-1 and an object located above or otherwise in proximity to parking sensor device 100-1.

Wireless interface 160 may permit parking sensor device 100-1 to communicate wirelessly with one or more other devices. Such other devices may include other parking sensor devices. In such embodiments, parking sensor devices may communicate in the form of a mesh network in order to communicate with a host system, such as a parking sensor gateway. In other embodiments, each parking sensor device may communicate directly with a parking sensor gateway. In some embodiments, wireless interface 160 uses a low-power communication protocol such as a communication protocol based on the IEEE 802.15.4 standard. In some embodiments, Bluetooth or Wi-Fi may be used for communication by wireless interface 160. In still other embodiments, multiple wireless interfaces may be present that allow parking sensor device 100-1 to communicate via different protocols and, possibly, with different types of devices.

Processing system 110 may include a data analysis and calibration engine 111. Data analysis and calibration engine 111 may analyze data obtained from magnetometer 120 and ToF sensor system 130. Data analysis and calibration engine 111 may determine a baseline magnetic field strength value or range of magnetic field strength values to be indicative of no vehicle being above or otherwise in proximity to parking sensor device 100-1. Such a determination may be performed as detailed in relation to FIGS. 2-7. Data analysis and calibration engine 111 may also interpret distance measurements made by ToF sensor system 130 to determine whether such data is indicative of a vehicle being located above or otherwise in proximity to parking sensor device 100-1.

In some embodiments, a non-transitory processor readable medium may be used to store one or more parking space profiles in parking space profiles data store 150. A parking space profile may be used to define how calibration is performed based on characteristics of a particular type of parking space. For example, different types of parking spaces that are mapped to different types of parking space profiles may include: on-street parking spaces; long-term parking spaces (e.g., airport parking); commuting parking; etc. Each of these types of parking spaces may exhibit different types of usage characteristics.

Calibration of a magnetometer may be varied based on the particular parking space profile with which the parking space sensor is mapped. As a first example, long-term parking, such as an airport parking space, may tend to be occupied for long stretches of time, day and night (e.g., due to a person leaving her vehicle in the parking space while on a trip). Further, for popular long-term parking, such as a parking space near an airport terminal, the parking space may be occupied much more frequently than it is empty. An on-street parking space or parking space located proximate to a business district may tend to see fairly frequent turnover during the day and long stretches of time at night during which the parking space is unoccupied. (Such characteristics for on-street parking may be affected by local parking regulations, such as the amount of time vehicle is permitted to remain in an on-street parking space, whether parking is allowed overnight, etc.) Further detail regarding how different parking space profiles are used to calibrate parking sensor magnetometers is provided in relation to FIGS. 3-5.

For different types of parking spaces, a different parking space profile may be used that defines how data analysis and calibration engine 111 performs calibration on data received from magnetometer 120. During an initial configuration process, a particular parking space profile from parking space profiles data store 150 may be activated that controls calibration based on the type of parking space in which parking sensor device 100-1 is installed. In other embodiments, rather than parking space profiles data store 150 being stored locally by parking sensor device 100-1, a particular parking space profile may be loaded onto parking sensor device 100-1 when parking sensor device 100-1 is being initially installed and configured.

In some embodiments, data analysis and calibration engine 111 performs calibration and analysis of data from magnetometer 120 locally. In such an arrangement, raw data measured by magnetometer 120 and/or ToF sensor system 130 is processed locally at parking sensor device 100-1 to determine whether or not a vehicle is parked above or otherwise in proximity to parking sensor device 100-1. In such embodiments, wireless interface 160 may primarily be used to transmit an indication of whether or not the associated parking space is occupied and an identifier of parking sensor device 100-1. In some embodiments, such indication may be transmitted periodically, in response to inquiry, or when a transition occurs from the parking space being occupied by a vehicle to unoccupied or from unoccupied to occupied. Additionally or alternatively, data obtained from magnetometer 120 and/or ToF sensor system 130 may be transmitted to a remote system, such as a parking sensor gateway system, for analysis. In such an arrangement, less processing may be performed at parking sensor device 100-1; however, more data may need to be transferred to the parking sensor gateway system via wireless interface 160. In some embodiments, both analysis at parking sensor device 100-1 and remote analysis at a parking sensor gateway system may be performed. For example, in some embodiments, if the analysis at parking sensor device 100-1 is inconclusive as to whether or not a vehicle is present, additional processing may be performed in a parking sensor gateway system. For example, the parking sensor gateway system may have access to information that parking sensor device 100-1 does not, such as data gathered by parking sensor devices located in adjacent parking spaces to parking sensor device 100-1.

Figure 2:
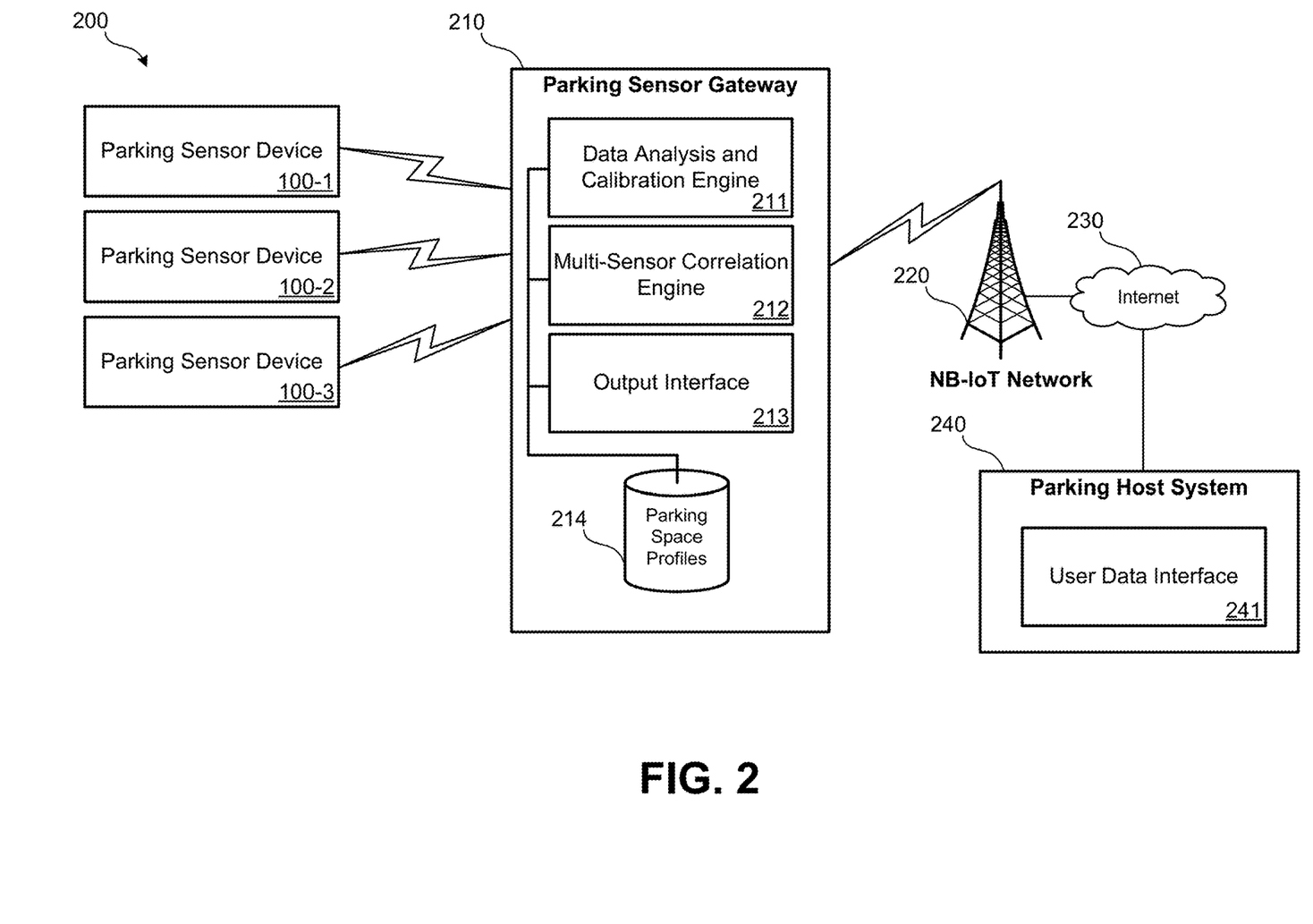
FIG. 2 illustrates an embodiment a parking sensor system.

FIG. 2 illustrates an embodiment of a parking sensor system. Parking sensor system 200 may involve multiple parking sensor devices communicating with a single parking sensor gateway. Parking sensor system 200 may include: parking sensor devices 100, parking sensor gateway 210, narrowband internet of things (NB-IoT) network 220, the Internet 230, and parking host system 240. A parking sensor device may be located in each parking space in a particular parking lot, parking garage, or on the street. FIG. 2 illustrates three parking sensor devices. This is for simplicity only. In some situations, scores or even hundreds of parking sensor devices may be in parking spaces in a given parking area; alternatively, fewer parking sensor devices may be present. Each of these parking sensor devices 100 may communicate directly with parking sensor gateway 210 via wireless communication. In other embodiments, a mesh network among parking sensor devices 100 may be used to create a communication network for communication with parking sensor gateway 210. Each of parking sensor devices 100 may function as detailed in relation to parking sensor device 100-1 of FIG. 1.

Parking sensor gateway 210 may include various components that are used to process data received from parking sensor devices 100. Parking sensor gateway 210 may include one or more computer server systems that include computerized components, such as one or more processors, communication buses, network interfaces, etc. Parking sensor gateway 210 may include: data analysis and calibration engine 211, multi-sensor correlation engine 212, output interface 213, and parking space profiles data store 214. In some embodiments, measurements made using a magnetometer and/or a ToF sensor may be transmitted from a parking sensor device, such as parking sensor device 100-1, to parking sensor gateway 210 for analysis. In such embodiments, data analysis and calibration engine 211 may be executed using one or more special or general purpose processors and may function similarly to data analysis and calibration engine 111 detailed in relation to FIG. 1. Calibration data determined by data analysis and calibration engine 211 may be transmitted back to the respective parking sensor device of parking sensor devices 100 or may be used locally by parking sensor gateway 210 for use in determining whether the vehicle is present in a parking space in which the corresponding parking sensor device is installed. Therefore, in some embodiments, parking sensor devices may only transmit data; analysis and calibration may be performed remotely at parking sensor gateway 210 to determine whether or not a vehicle is present in the associated parking space.

Regardless of whether some or no processing is performed at parking sensor devices 100, in some situations parking sensor gateway 210 may use multi-sensor correlation engine 212 to determine if a parking space is occupied. Multi-sensor correlation engine 212 may be executed using one or more special or general purpose processors. Therefore, multi-sensor correlation engine 212 may be stored in the form of processor-readable instructions using a non-transitory processor-readable medium. As an example, if magnetometer measurements from a particular parking sensor device are inconclusive as to whether a parking space is occupied by a vehicle or not, parking sensor gateway 210 may use multi-sensor correlation engine 212 to compare measurements performed by the parking sensor device in the parking space to measurements performed in adjacent parking spaces by other parking sensor devices or, more generally, to measurements performed in the same parking facility or region as the parking space. For example, a large truck parking in a parking space may cause an increased magnetic field strength measurement in an adjacent parking space, even though the adjacent parking space may be unoccupied by a vehicle. As another example, a sudden power change in the vicinity of the parking space may affect multiple parking sensor devices, such as the lights turning on within a parking garage. By parking sensor gateway 210 identifying that a sudden change occurs in the magnetic field strength measurement of multiple parking sensor devices at approximately the same time, multi-sensor correlation engine 212 may determine that it is unlikely that a vehicle has caused the sudden change, but rather an external condition has created noise. Multi-sensor correlation engine 212 may therefore control whether a particular parking space is identified as occupied based on data obtained from other parking sensor devices located in other parking spaces. Further detail regarding such correlation among parking spaces is provided in relation to FIG. 7. Parking space profiles data store 214 may function as detailed in relation to parking spaces profiles data store 150.

Output interface 213 may serve to output indications of whether a parking space is occupied or not locally and/or to a remote system. Locally, output interface 213 may present on a sign, screen, display, or some other form of electronic output device an indication of whether one or more parking spaces are occupied or available. For example, a display may indicate a number of parking spaces within a parking facility that are available for parking. Additionally or alternatively, output interface 213 may communicate wirelessly with the NB-IoT network. An NB-IoT network may communicate from a small number of communication towers over a large geographic area at a low bandwidth. Parking sensor gateway 210 may only transmit indications of whether or not parking spaces are available or occupied via an NB-IoT network 220. In other embodiments, a different form of wireless network may be used to communicate between parking sensor gateway 210 in the remote system or network, such as Internet 230 and/or parking host system 240.

Parking host system 240 may be used to output user data interface 241. User data interface 241 may allow information about whether or not various parking spaces monitored using parking sensor devices 100 are occupied or unoccupied. Such data may be used to provide mobile applications, websites, automated electronic billboards, or various other forms of ways of indicating whether or not various parking spaces are occupied or unoccupied by vehicles. User data interface 241 may be used for other purposes, such as regulating the cost of parking in a facility based on the number of parking spaces that are occupied or unoccupied.

Figure 3:
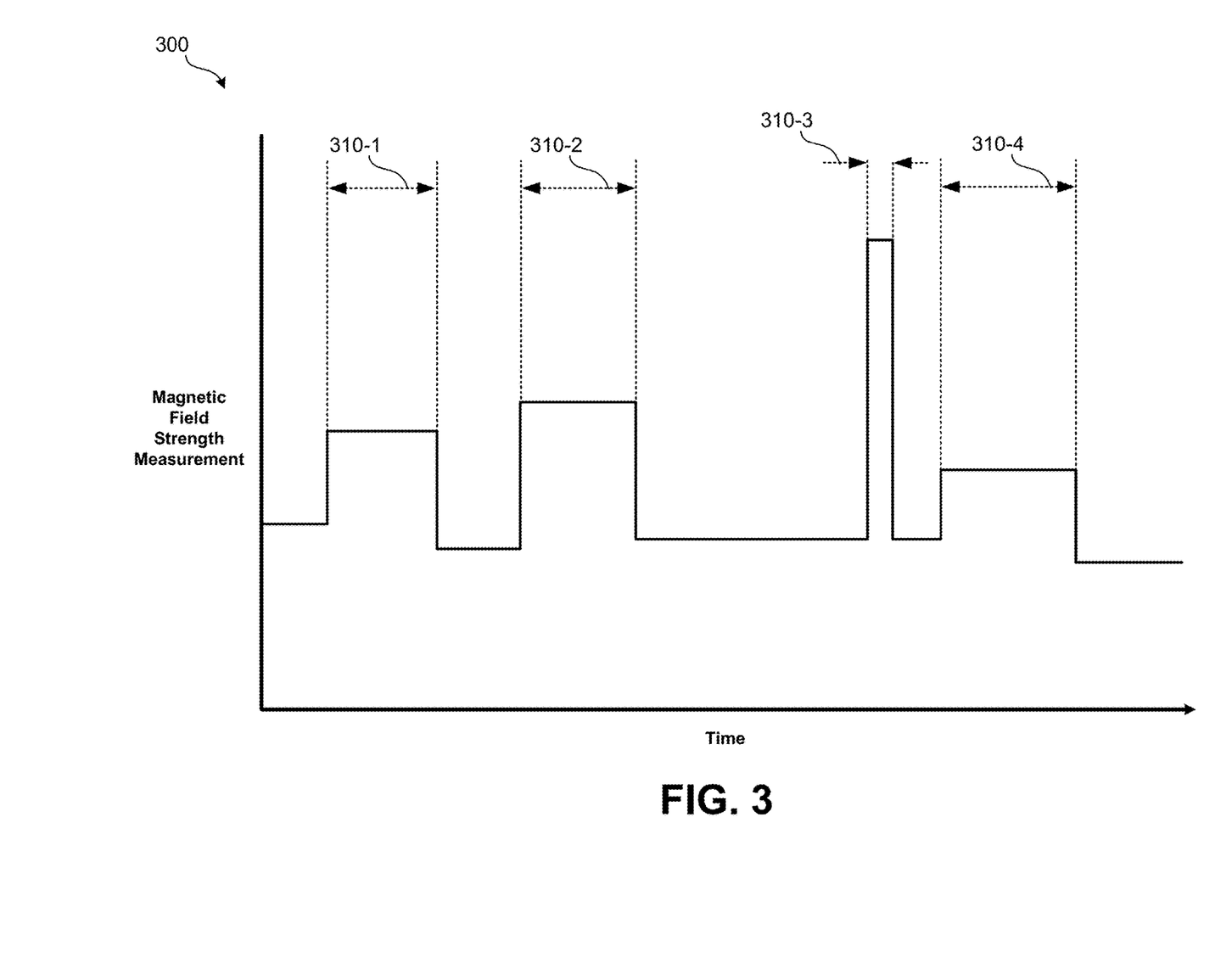
FIG. 3 illustrates an embodiment of magnetic field strength measurements made by a parking space sensor.

FIG. 3 illustrates an embodiment of a graph 300 of magnetic field strength measurements made by a parking space sensor. Graph 300 represents magnetic field strength measurements that may be made, over time, by a magnetometer of a parking sensor device. Over time, drifts may be observed in measurements made by the magnetometer; therefore, periodic or occasional recalibration of the measurements from the magnetometer may be necessary in order to determine a baseline magnetic field strength measurement indicative of a vehicle not being present within the parking space. Graph 300 illustrates various periods of time during which the magnetic field strength may vary. For instance, in graph 300, time periods 310 (310-1, 310-2, 310-3, and 310-4) illustrate times during which elevated magnetic field strength measurements were detected for different durations of time. These measurements may be indicative of a vehicle being present. However, over time, the baseline magnetic field strength measurement indicative of no vehicle being present may increase or decrease (i.e., there may be drift). Therefore, a baseline magnetic field strength measurement may be recalculated periodically using a rolling historic window of magnetometer measurements such that over time measurements from the magnetometer can continue to be used to accurately determine whether a vehicle is present within a parking space.

Figure 4:
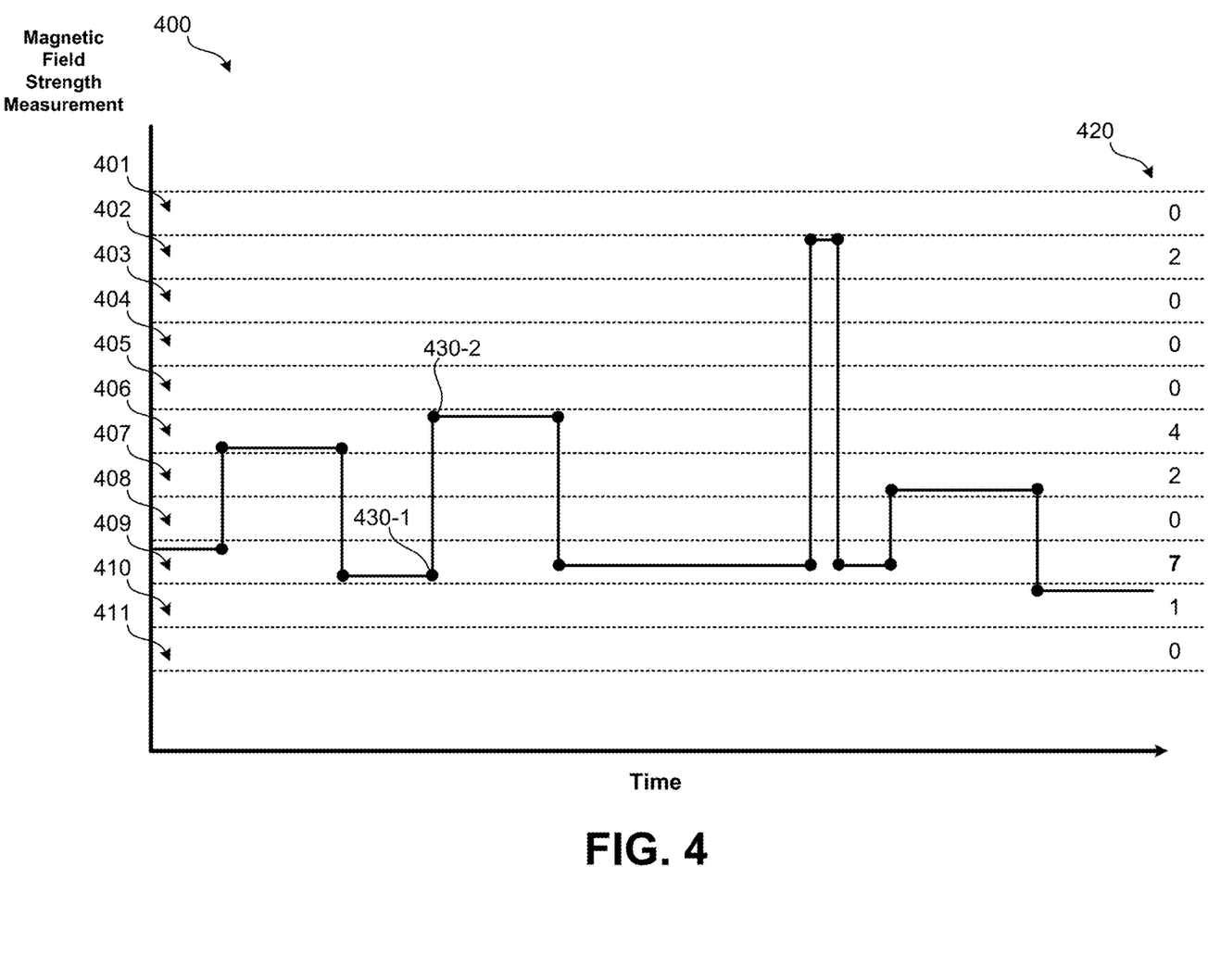
FIG. 4 illustrates an embodiment of magnetic field strength measurements being used to calculate a vehicle-detection baseline.

FIG. 4 illustrates an embodiment of a graph 400 of magnetic field strength measurements being used to calculate a vehicle-detection baseline. In graph 400, magnetic field strength ranges 401 through 411 are illustrated. Each of magnetic field strength ranges 401 through 411 refers to different ranges that are indicative of different amounts of magnetic field strength. The size and number field strength ranges may be predefined and programmed into the data analysis and calibration engine (111, 211) performing calibration. For example, a magnetometer incorporated as part of the parking sensor device may have a field measurement range of −8 Gauss to +8 Gauss. The measurement resolution within this field measurement range may, for example, be 4.35 milligauss. The digital values output by the magnetometer may range from −2048 to +2048, which can then be converted to Gauss. Since a key aspect of the measurements used herein is the delta in field strength measurements (rather than the absolute measured values), the digital values output by the magnetometer may not be converted to Gauss. Rather, the ranges may be established to cover the possible digital values output by the magnetometer. For example, for a magnetometer that can output values ranging from −2048 to +2048, one magnetic field strength range may be from 0-256. Other types of magnetometers may have different measurement ranges, different measurement resolutions, and different output value ranges; however, the same concept of creating multiple magnetic field strength ranges based on the raw digital output of the magnetometer can be used.

In graph 400, measurements from the magnetometer of the parking sensor device are only taken at the start and end of a magnetic field strength measurement transition. For example, measurements are captured for data points 430-1 and 430-2. Magnetometer measurements used for calibration purposes may be measured or stored based on the parking space profile that is active for the parking sensor device. This parking space profile may only use measurements at the start and end of a magnetic field strength change that is greater than a defined threshold. Such data points can be referred to as "event-driven" data points, since the storage of such data points is based on an event (e.g., vehicle arriving, vehicle leaving) being detected. Therefore, each data point, such as the dots indicated for data points 430-1 and 430-2, represents data points that will be used for calibration purposes.

Such an arrangement in which calibration of the magnetometer is based only on "event-driven" data points may be useful in scenarios where a vehicle tends to remain within a parking space for long period of times. Therefore, such an event-driven arrangement may be used to calibrate parking spaces for long term parking, such as airport parking, and other forms of parking that is typically occupied (e.g., by a security vehicle, by a facilities vehicle). While it can be expected that different vehicles will cause the magnetometer readings to change into various different magnetic field strength ranges, when the vehicles exit the parking space, the magnetometer readings can be expected to change to within the same magnetic field strength range that will be determined to be the vehicle detection baseline.

For each of the predefined magnetic field strength ranges, a count is detected of the number of data points that fall within the range for the rolling historic window. Count column 420 illustrates the number of data points present in each range for the illustrated sample data points. Magnetic field strength range 409 includes seven data points. Therefore, magnetic field strength range 409 is selected as the baseline range indicative of a vehicle not being present in the parking space in which the parking sensor device is installed.

As can be seen in graph 400, the final measurement appears to be low in magnetic field strength and thus be indicative of a vehicle not being present. This measurement being present in range 410 may be indicative of the magnetometer drifting. If similar measurements within range 410 continue to be observed in the future, at some point when the calibration is recalculated, if the data point count for range 410 exceeds the count for magnetic field strength range 409, magnetic field strength range 410 may be used as the baseline range indicative of a vehicle not being present. The size of the rolling window of measurements used to calibrate the magnetometer may be based on time or number of measurements.

In some embodiments, in order for a vehicle to be determined to be present, a magnetic field strength measurement at least a predefined amount greater than the window may be required to be detected. In other embodiments, in order for a vehicle to be determined to be present, a magnetic field strength measurement that is within a range at least two ranges greater than the baseline may be necessary. For example, if the baseline is magnetic field strength range 409, for a vehicle to be detected as present, a measurement in range 407 or greater may be necessary.

In some embodiments, the baseline range is recalculated whenever a new data point is collected. In other embodiments, after a predefined number of new data points is collected, the baseline range is recalculated. In other embodiments, the baseline range may be recalculated based upon an external trigger, such as a user or remote system indicating that a baseline range should be recalculated. In other embodiments, a predefined period of time elapsing may result in the baseline range being recalculated.

Figure 5:
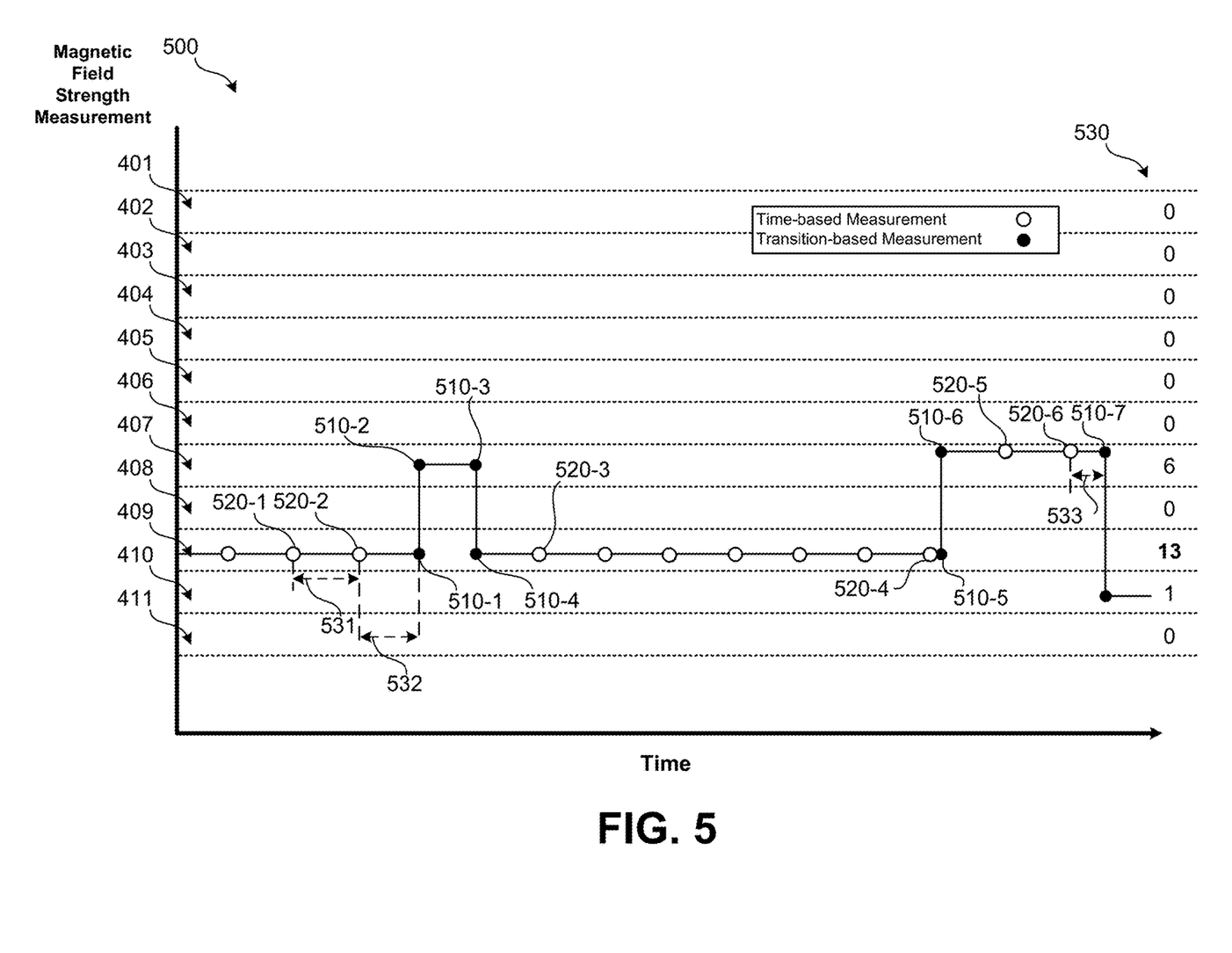
FIG. 5 illustrates another embodiment of magnetic field strength measurements being used to calculate a vehicle-detection baseline.

FIG. 5 illustrates an embodiment of a graph 500 of magnetic field strength measurements being used to calculate a vehicle-detection baseline. In graph 500, magnetic field strength ranges 401 through 411 are again illustrated. Again, the size and number field strength ranges may be predefined and programmed into the data analysis and calibration engine (111, 211) performing calibration. When a calibration is to be performed, a rolling window of historical and strength measurements may be analyzed. For example, in some embodiments, the previous 200 measurements may be analyzed.

For the measurements represented on graph 500, a different parking space profile is active than in graph 400. While in graph 400, measurements from the magnetometer of the parking sensor device were taken at the start and end of a magnetic field strength measurement transitions, for the data points of graph 500, in addition to data points taken at the start and end of magnetic field strength transitions, time-based (e.g., periodic) measurements of the magnetic field strength are made when at least an amount of time has passed without a transition. Data points 510 (510-1, 510-2, 510-3, 510-4, 510-5, 510-6, 510-7), which are represented by black dots, refer to data points measured due to detected transitions in field strength. Data points 520 (520-1, 520-2, 520-3, 520-4, 520-5, 520-6), which are represented by white dots, refer to data points used to calculate the baseline due to a time elapsing since a previous time-based measurement or transition-triggered measurement was made. It should be understood that for simplicity of FIG. 5 only some of data points 510 and data points 520 have been labeled.

The parking space profile used to collect the data illustrated in graph 500 may be useful if a parking space is unoccupied for significant stretches of time. For instance, an on-street parking space or parking space located in a garage or lot near a downtown or business area may be occupied a handful of times during the day and may be empty for the majority of the night. By collecting a number of data points based on time, over the course of the night it can be expected that the majority of data points collected will be indicative of when the parking space was empty.

Various parking space profiles can be created by varying: 1) the amount of time that elapses since a previous data point until when a time-base measurement is stored; and 2) the total number of measurements used to determine the baseline range for determining if a vehicle is present. Therefore, the concept indicated in FIG. 5 can be used to create multiple different parking space profiles. These parking space profiles may be used based on the frequency of the usage pattern of a parking space. Therefore, different parameters for a parking space profile may be tested to select or create a parking space profile that performs best at accurately determining whether or not a vehicle is present within a parking space.

For the active parking space profile of FIG. 5, if a threshold period of time 531 has elapsed since a previous measurement (regardless of whether the previous data point was based on a time-based measurement or a transition-based measurement), a time-based measurement is stored. Since time period 532 is smaller in duration than threshold period of time 531, the occurrence of transition-based measurement corresponding to data point 510-1 preempts a time-based measurement from being stored shortly thereafter. After the transition-based measurement of data point 510-4, threshold period of time 531 elapses and causes a time-based measurement of data point 520-3 to be stored. It is possible for a short period of time to elapse between a time-based measurement and a later transition-based measurement being stored. For example, after the time-based measurement of data point 520-4, a transition-based measurement for data point 510-5 is stored. Transition-based measurements can be stored regardless of the amount of time that has elapsed since a previous data point. For instance, time period 533 is significantly shorter than threshold period of time 531. However, since data point 510-7 corresponds to a transition, data point 510-7 is stored.

For each of the predefined magnetic field strength ranges, a count is detected of the number of data points that fall within the range for the rolling historic window. The size of the rolling historic window can be customized for different types of parking space profiles. Count column 530 illustrates the number of data points (including both time-based data points and event-based data points) present in each range for the illustrated sample data points. Magnetic field strength range 409 includes seventeen data points. Therefore, magnetic field strength range 409 is selected as the baseline range indicative of a vehicle not being present in the parking space in which the parking sensor device is installed.

Other parking space profiles may cause different data points to be used to calibrate the magnetometer by determining the baseline range indicative of no vehicle being present. In some parking space profiles, only periodic time-based data points are collected. In other parking space profiles, time-based data points are collected when a predefined amount of time has elapsed since a previous time-based measurement (regardless of transition-based measurements). In other embodiments, only trailing edge event-driven data points are collected (similar to data points 510-3, 510-4). In other embodiments, only leading edge event-driven data points are collected (similar to data points 510-1, 510-2).

Figure 6:
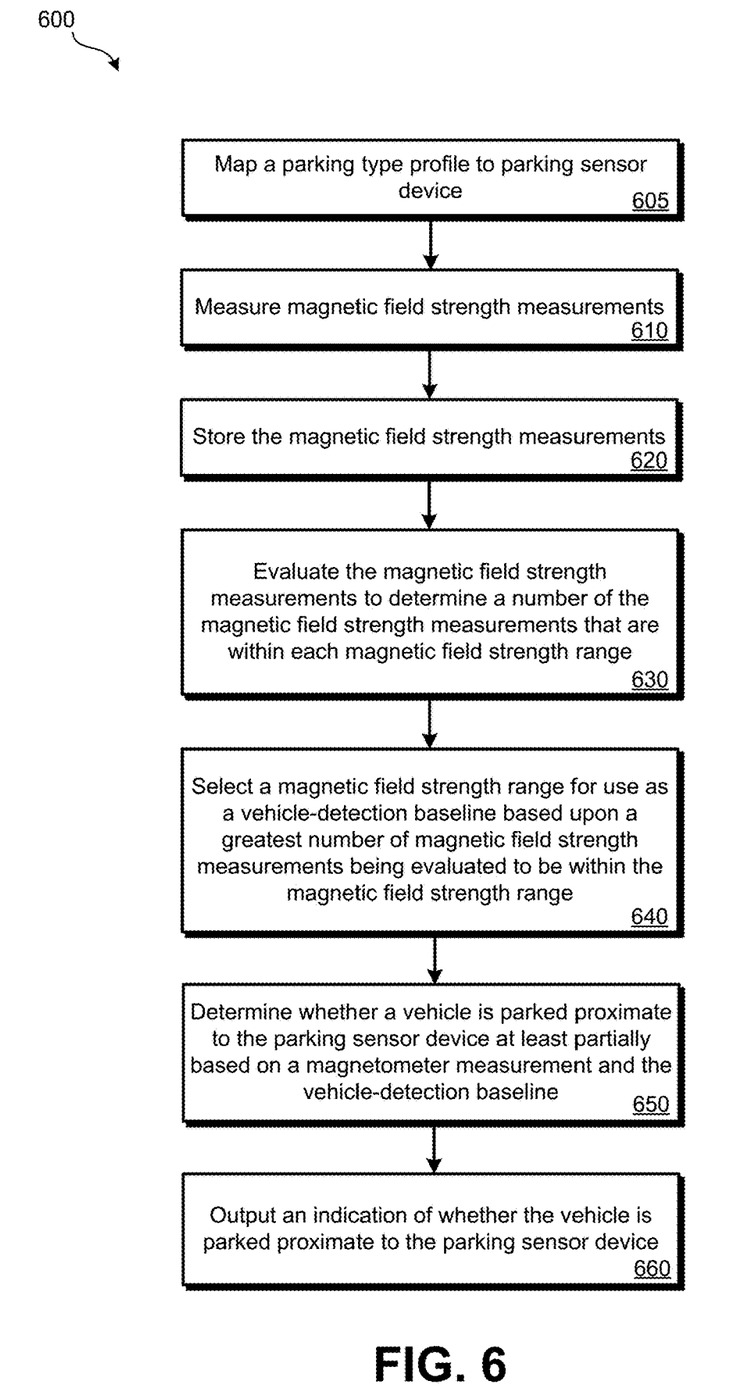
FIG. 6 illustrates an embodiment of a method for determining whether a vehicle is present in a parking space using a magnetometer.

Various methods may be performed using the arrangements detailed in relation to FIGS. 1-5. FIG. 6 illustrates an embodiment of a method for determining whether a vehicle is present in a parking space using a magnetometer. Each block of method 600 may be performed by a parking sensor device. Alternatively, some or all of the processing and calibration may be performed remotely, such as by a parking sensor gateway or by a parking host system. At block 605, a parking space profile may be mapped to the parking sensor device that is installed in the parking space. In some embodiments, a separate testing process may first be performed to select a parking space profile or generate a customized parking space profile. Depending on the parking space profile mapped to the parking sensor device, only transition-based measurements may be used or transition-based measurements in combination with time-based measurements may be used. If time-based measurements are to be used, the parking space profile may define: 1) the time interval after which a measurement should be taken; and 2) the size of the historic rolling window that should be analyzed.

At block 610, magnetic field strength measurements may be measured using a magnetometer. The magnetometer may only periodically be provided power such that power can be conserved when a measurement is not needed. Alternatively, the magnetometer may continuously be powered such that the magnetometer outputs a stream of magnetic field strength measurements. At block 620, at least some of the measured magnetic field strength measurements may be stored. In some embodiments, which magnetic field strength measurements are stored may be based on a parking space profile that is active. For example, magnetic field strength measurements may only be stored if at the beginning or end of a transition to a magnetic field strength that varies by at least a threshold difference over a defined period of time (an "event"). In other embodiments, additionally or alternatively, magnetic field strength measurements may be made periodically or may be made if a period of time has elapsed since a previously-stored data point, regardless of whether the previous data point was stored due to an event or was a time-based data point.

In some embodiments, the magnetic field strength measurements may be stored at block 620 at the parking sensor device. In such embodiments, calibration may be performed by the parking sensor device itself. In some embodiments, the magnetic field strength measurements may be transmitted from the parking sensor device to the parking sensor gateway and may be stored by the parking sensor gateway at block 620. Such embodiments may involve more data being transmitted from the parking sensor device to the parking sensor gateway but may result in processing being shifted from the parking sensor device to the parking sensor gateway. In some embodiments, the magnetic field strength measurements may be analyzed at both the parking sensor device and the parking sensor gateway. In still other embodiments, magnetic field strength measurements may be transmitted to a remote parking host system for analysis and calibration. By storing new data points, old data points may be discarded. A historic rolling window may store up to a predefined number of data points. When a new data point is added, an oldest data point may be discarded. For example, the most recent 200 data points may be stored at any given time.

In some embodiments, block 630 may be performed after each new data point is stored or after a predefined number of new data points have been stored (e.g., after each fifty data points). In some embodiments, block 630 may be performed on a periodic basis, such as after a defined period of time has elapsed. In other embodiments, block 630 may be performed in response to a received signal, such as a message requesting recalibration from a parking sensor gateway or parking host system (if block 620 was performed by the parking sensor device). Block 630 may be performed by a parking sensor gateway in response to a message requesting recalibration from the parking sensor device or the parking host system. Combination of triggers to perform block 630 may also be possible. For example, recalibration may be performed after 50 data points have been received or a predetermined amount of time has elapsed, whichever occurs first.

At block 630, the magnetic field strength measurements that were stored at block 620 as part of a historic rolling window may be evaluated. The magnetic field strength measurements may be evaluated to determine a number of magnetic field strength measurements that fall within each magnetic field strength range of multiple predefined magnetic field strength ranges. Block 630 may result in a count being calculated for each magnetic field strength range. In some embodiments, there may be 5, 10, 15, or 20 magnetic field strength ranges. In some embodiments, there may be anywhere between 3 and 50 magnetic field strength ranges. Block 630 may be performed by the parking sensor device. Additionally or alternatively, if magnetic field strength measurements have been transmitted to the parking sensor gateway, the parking sensor gateway may perform block 630. Additionally or alternatively, if magnetic field strength measurements have been transmitted to the parking host system, the parking host system may perform block 630.

At block 640, a magnetic field strength range may be selected as a vehicle detection baseline indicative of no vehicle being present within the parking space at which the parking sensor device is installed. The magnetic field strength range may be selected based on it containing the greatest number of magnetic field strength measurements within the rolling historic window as evaluated at block 630.

Block 640 may be performed by the same system or device that performed block 630. That is, either the parking sensor device, the parking sensor gateway, or the parking host system may perform block 640. In some embodiments, such as if blocks 630 and 640 are performed remote from the parking sensor device, an indication of the selected magnetic field strength range may be transmitted to the parking sensor device. In other embodiments, data regarding the magnetic field strength range selected at block 640 may be maintained remotely from the parking sensor device. Therefore, the raw data may be analyzed remotely from the parking sensor device using the remotely perform calibration.

At block 650, using the vehicle detection baseline determined at block 640, it may be determined whether a vehicle is parked proximate to the parking sensor device. The magnetic field strength range selected as the vehicle detection baseline may be used to determine if a vehicle is present by if a magnetic field strength measurement that is at least a threshold difference greater (or smaller) than a mean, maximum, or minimum of the vehicle detection baseline, a vehicle may be determined to be present. In other embodiments, in order for a vehicle to be determined to be present, a magnetic field strength measurement may be required to be measured that falls within a greater magnetic field strength range. In other embodiments, a range that is at least two, three, or more ranges greater (or less than) than the baseline range may be necessary. For example, referring to FIG. 4, if the baseline range is 409 and the measurement is required to be at least two ranges higher for a positive identification of a vehicle, a magnetic field strength measurement may be required to be measured within range 407 (or greater in magnitude). The determination of block 650 may be performed directly by the parking sensor device, the parking sensor gateway, or the parking host system. If the vehicle is determined to be parked proximate to the parking sensor device within a parking space, the parking sensor device may transmit an indication indicative of the vehicle being present to the parking sensor gateway at block 660. Similarly, if a vehicle is determined to not be proximate to the parking sensor device within the parking space, the parking sensor device may transmit an indication indicative of the vehicle not being present to the parking sensor gateway at block 660. In some embodiments, other forms of outputting an indication of whether the parking space is occupied may be used. For example, a light nearby the parking space may be illuminated different colors based on whether the parking space is or is not occupied. Block 660 may involve a wireless transmission being made by the parking sensor device to a remote display and/or parking sensor gateway. In some embodiments, the transmission is sent periodically to indicate the current state of the parking space. In some embodiments, the transmission is sent when a change in state of the parking space from occupied to unoccupied or from unoccupied to occupied is identified. In embodiments where the calibration data is maintained remotely from the parking sensor device, the determination of block 650 and the output of the indication of block 660 may be performed remotely from the parking sensor device, such as at the parking sensor gateway or the parking host system.

Figure 7:
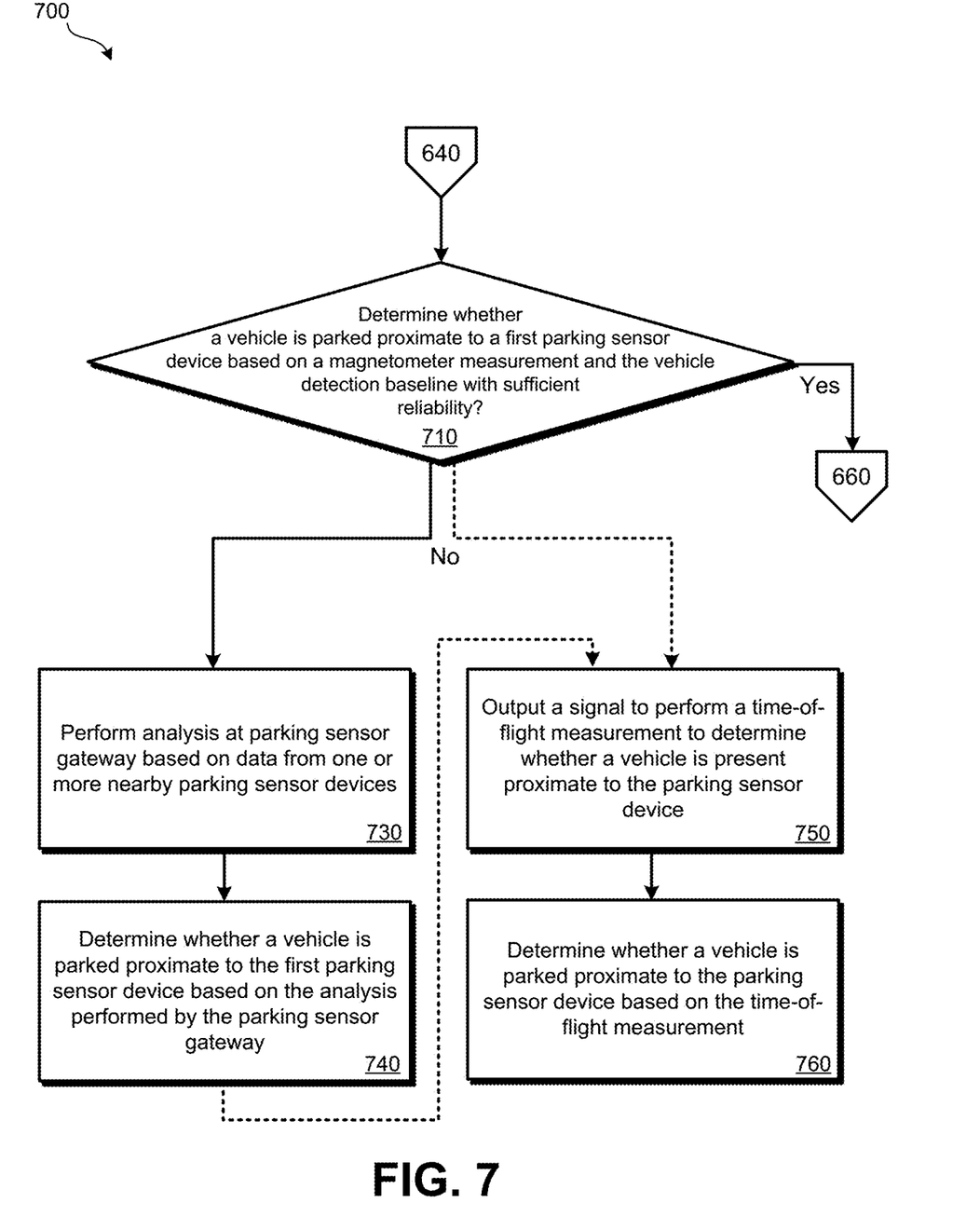
FIG. 7 illustrates an embodiment of a method for determining whether a vehicle is present in a parking space using a magnetometer, ToF sensor, and a parking sensor system.

FIG. 7 illustrates an embodiment of method 700 for determining whether a vehicle is present in a parking space using a magnetometer, ToF sensor, and a parking sensor system. Each block of method 700 may be performed by a parking sensor gateway. Alternatively, some or all of the processing and calibration may be performed by a parking host system. Method 700 may be performed when data collected by a particular parking sensor using its magnetometer is inconclusive as to whether a vehicle is present or not. At block 710, an initial attempt to determine whether a vehicle is parked proximate to a parking sensor device may be performed using one or more magnetometer measurements, such as using the vehicle detection baseline selected at block 640. Block 710 may represent a modified version of block 650. Additionally at block 710, it may be determined, such as by the parking sensor gateway, that a determination as to whether the parking space is occupied cannot be determined with sufficient confidence. For instance, while an increase in magnetic field strength may be detected using the magnetometer, this increase may be less than a defined threshold or the increase may not fall within a magnetic field strength range that is at least a defined number of ranges greater than the baseline range. If the determination of block 710 is no, method 700 may proceed to block 730 and/or 750. If the determination is yes, method 700 may proceed to block 660 of FIG. 6.

In some embodiments, blocks 730 and 740 are performed. In other embodiments, blocks 750 and 760 are performed. In some embodiments, blocks 730 through 760 are performed. At block 730, an analysis may be performed by the parking sensor gateway using data received from one or more nearby parking sensor devices. These nearby parking sensor devices may be located in parking spaces adjacent to a first parking space in which the parking sensor for which whether a vehicle is or is not present could not accurately be determined. For example, the analysis of block 730 may involve data from a parking space to the left and a parking space to the right of the first parking space for which block 710 was performed. The analysis performed at block 730 may determine whether there is a temporal correlation between the magnetometer measurement analyzed at block 710 and changes in magnetometer measurements by the parking sensor devices in adjacent parking spaces. If, for example, a significant (e.g., larger) change in magnetic field strength measurement occurs at an adjacent parking space at approximately the same time as the change in magnetic field strength observed in the first parking space, it may be determined that the magnetic field strength measurement measured by the first parking sensor device was likely due to the change (e.g., a vehicle arriving or leaving) in the adjacent parking space. For example, a temporal correlation may be considered present if within a defined time period, such as 3 seconds, a significant change is measured in an adjacent parking space that may affect magnetometer readings of the first parking sensor device. Conversely, if a smaller or no change in magnetic field strength occurs at an adjacent parking space at approximately the same time as the change in magnetic field strength measured in the first parking pace, it may be determined that the magnetic field strength measurement measured by the first parking sensor device was likely due to a change in the first parking space (e.g., a vehicle arriving or leaving).

As another example, if approximately the same magnetic field strength measurements are measured at one or more adjacent parking spaces, it may be determined that the magnetic field strength measurements performed by the first parking sensor device are due to noise caused by a source other than a vehicle entering or exiting the parking space in which the first parking sensor device is installed. For instance, a similar magnetic field strength measurement may be observed across multiple parking sensor devices when a large noise source changes state, such as the lights within a parking garage being activated or deactivated. Such an event may cause changes in a magnetic field observed across many parking sensor devices at approximately the same time.

At block 740, a determination as to whether a vehicle is present in the parking space associated with the first parking sensor device may be performed at least in part of the analysis performed at block 730 that uses data from one or more adjacent parking spaces. A vehicle may be determined to not be present if a larger change in magnetic field strength is detected at one or more adjacent parking spaces at approximately the same time. If approximately the same change in magnetic field strength is observed at multiple parking sensor devices including the first parking sensor device, these measurements may be determined to be inconclusive and not reflective of whether a vehicle is or is not present. If one or more adjacent parking sensor devices do not detect any change in magnetic field strength, it may be determined that the change in magnetic field strength measured at block 710 is indicative of a vehicle being present within the parking space associated with the first parking sensor device. For example, a small change in magnetic field strength may be due to a small vehicle, such as a motorcycle or golf cart, being parked within the parking space. If the determination of block 740 is inconclusive, method 700 may perform block 750.

At block 750, the parking sensor device may be instructed or may determine that it is to perform a ToF measurement. A ToF sensor may be used to perform the ToF measurement; such a ToF sensor may use more power than a magnetometer, as such a ToF measurement may only be performed when needed to resolve an ambiguity in whether a vehicle is present in a parking space. At block 750, an electromagnetic signal may be output and a reflection may be received back by the parking sensor device. Based upon a phase difference between the transmitted signal and the received signal, a round-trip distance may be determined. If the round-trip distance is greater than a defined threshold distance (or defined phase difference), it may be determined that a vehicle is not present. In some embodiments, such as if the ToF measurement is performed in an outdoor parking lot in which there is no object to reflect the emitted light or magnetic signal, no reflection may be received. The absence of a reflection may be indicative of a vehicle not being present.

At block 760, a determination may be performed as to whether a vehicle is parked above or otherwise proximate to the parking sensor device based on the ToF measurement. If the ToF measurement exceeds a defined threshold or a reflection is not observed, it may be determined that no vehicle is present. If the ToF measurement is below the defined threshold, it may be determined that a vehicle is present within the parking space monitored by the parking sensor device. This determination may be performed at the parking sensor device or may be performed remotely, such as at the parking sensor gateway or parking host system.

Figure 8:
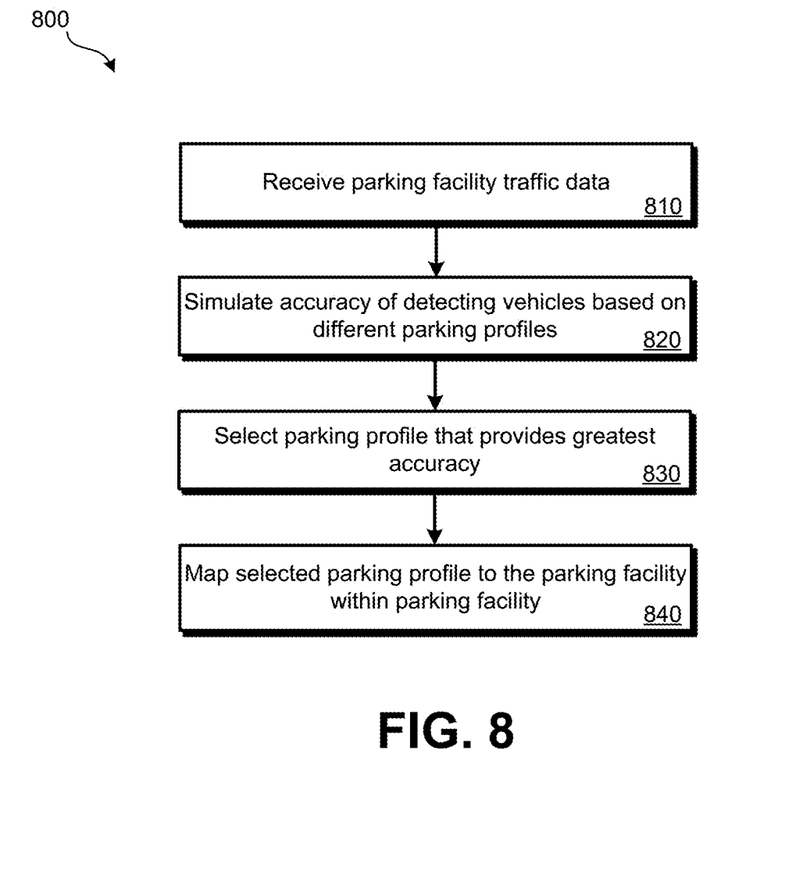
FIG. 8 illustrates an embodiment of a method that may be performed to select or create a parking space profile to be used for a parking facility.

FIG. 8 illustrates an embodiment of a method 800 that may be performed to select or create a parking space profile to be used for a parking facility (e.g., lot, garage, on-street parking area). Method 800 may be performed by a gateway system, parking host system, or simulator system that outputs data to the parking sensor gateway or parking host system. While method 800 refers to a single parking space profile being used for an entire parking facility, different parking space profiles may be selected or generated for different parts of a parking facility. For instance, in a particular parking space, a vehicle may tend to always be present, such as a security vehicle; other parking spaces may tend to see usage during the day, but long stretches of being empty at night. In some embodiments, a customized parking space profile is selected or created for each individual parking space within a parking facility. The remainder of method 800 assumes that a single parking space profile is to be activated for all parking space sensor devices at a parking facility.

At block 810, parking facility traffic data may be obtained. In some embodiments, parking sensor devices or manual monitoring may be used to create parking facility traffic data. Parking facility traffic data may include timestamped and date-stamped entries and exits of vehicles from individual parking spaces within the parking facility. Such parking facility traffic data may be gathered over a period of 1 to 10 weeks. The longer the period of time, the more accurate the overall parking facility traffic data may be. In some embodiments, the parking facility traffic data may be created by a simulator. The simulator may be provided various metrics, such as: the size of the parking facility (e.g., the number of parking spaces); the location of the parking facility; the types of facilities (e.g., businesses, transportation infrastructure, stadiums, attractions) located near-by; and major roads. The simulator may then create parking facility traffic data based on the inputs.

At block 820, different preexisting parking space profiles may be tested against the parking facility traffic data to determine which parking space profile is the most accurate in determining when vehicles are and are not present in parking spaces. As an example, Table 1 indicates four possible preexisting parking space profiles.

TABLE 1

| Preexisting Profile Number | Transition-based Measurements? | Time-based Measurements | Number of Values in Historic Rolling Window | Threshold Time Period for Performing a Time-Based Measurement |
|---|---|---|---|---|
| 1 | Y | N | 30 | N/A |
| 2 | Y | N | 18 | N/A |
| 3 | Y | Y | 34 | 100 minutes |
| 4 | Y | Y | 25 | 30 minutes |

In some embodiments, only previously defined parking space profiles are tested to select a most effective previously-defined parking space profile. In other embodiments, a customized parking space profile may be created. The customized parking space profile may be configured to provide the most accurate detection based on the parking facility traffic data. A customized parking space profile may customize: 1) whether time-based measurements are used; 2) the size of the historic rolling window; and/or 3) the threshold time period after which a time-based measurement is performed. At block 830, either a preexisting profile or a created customized parking space profile is selected. At block 840, the selected parking space profile is mapped to the parking spaces of the parking facility. Block 840 can include transmitting the selected parking space profile to the parking host system, the parking sensor gateway, and/or the individual parking space sensor devices.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered.

What is claimed is:

1. A method for determining that a vehicle is present in a parking space, the method comprising:
    measuring, by a parking sensor device, a plurality of magnetic field strength measurements using a magnetometer installed at the parking space;
    evaluating the plurality of magnetic field strength measurements;
    selecting a magnetic field strength window from a plurality of magnetic field strength windows for use as a vehicle-detection baseline based upon evaluation of the plurality of magnetic field strength measurements; and
    determining the vehicle is parked within the parking space at least partially based on a magnetic field strength measurement in relation to the selected magnetic field strength window.

2. The method of claim 1, wherein evaluating the plurality of magnetic field strength measurements comprises determining a number of the plurality of magnetic field strength measurements that are within each magnetic field strength window of a plurality of magnetic field strength windows, wherein
each magnetic field strength window defines a range of magnetic field strengths.

3. The method of claim 2, wherein a greatest number of magnetic field strength measurements of the plurality of magnetic field strength measurements are evaluated to be within the magnetic field strength window.

4. The method of claim 1, further comprising:
selecting a parking space profile from a plurality of parking space profiles, wherein each parking space profile is configured for a different parking space usage pattern.

5. The method of claim 4, wherein:
the plurality of magnetic field strength measurements comprises magnetic field strength measurements stored in response to a change in magnetic field strength detected by the parking sensor device; and
the selected parking space profile is used to determine when the plurality of magnetic field strength measurements are made.

6. The method of claim 5, wherein:
the plurality of magnetic field strength measurements comprises magnetic field strength measurements stored in response to a threshold period of time having elapsed during which no magnetic field strength measurement has been stored; and
the selected parking space profile is used to determine when the plurality of magnetic field strength measurements are made.

7. The method of claim 1, wherein: evaluating the plurality of magnetic field strength measurements, selecting the magnetic field strength window, and determining whether the vehicle is parked proximate to the parking sensor device are each performed by the parking sensor device.

8. The method of claim 7, further comprising:
transmitting, by the parking sensor device, an indication that the parking space is occupied by the vehicle in response to determining that the vehicle is parked proximate to the parking sensor device based on the magnetic field strength measurement in relation to the selected magnetic field strength window.

9. The method of claim 1, wherein: evaluating the plurality of magnetic field strength measurements, selecting the magnetic field strength window, and determining whether the vehicle is parked proximate to the parking sensor device are each performed by a parking sensor gateway system.

10. The method of claim 1, wherein the parking sensor device is positioned on the ground within the parking space such that a magnetic field strength is measured for a region above the parking sensor device.

11. A system for determining that a vehicle is present in a parking space, the system comprising:
a parking space sensor device comprising: a wireless communication interface; and a magnetometer, wherein the parking space sensor device is configured to measure a plurality of magnetic field strength measurements using the magnetometer; and a computerized system configured to:
evaluate the plurality of magnetic field strength measurements;
select a magnetic field strength window from a plurality of magnetic field strength windows for use as a vehicle-detection baseline based upon evaluation of the plurality of magnetic field strength measurements; and
determine the vehicle is parked within the parking space at least partially based on a magnetic field strength measurement in relation to the selected magnetic field strength window.

12. The system of claim 11, wherein the computerized system is part of the parking space sensor device.

13. The system of claim 11, wherein the computerized system is part of a computerized system remote from the parking space sensor device.

14. The system of claim 11, wherein the computerized system being configured to evaluate the plurality of magnetic field strength measurements comprises the computerized system being configured to determine a number of the plurality of magnetic field strength measurements that are within each magnetic field strength window of a plurality of magnetic field strength windows, wherein
each magnetic field strength window defines a range of magnetic field strengths.

15. The system of claim 14, wherein a greatest number of magnetic field strength measurements of the plurality of magnetic field strength measurements are evaluated to be within the magnetic field strength window.

16. The system of claim 11, wherein the computerized system is further configured to select a parking space profile from a plurality of parking space profiles, wherein each parking space profile is configured for a different parking space usage pattern.

17. The system of claim 16, wherein:
the plurality of magnetic field strength measurements comprises magnetic field strength measurements stored in response to a change in magnetic field strength detected by the parking space sensor device; and
the selected parking space profile is used to determine when the plurality of magnetic field strength measurements are made.

18. The system of claim 16, wherein:
the plurality of magnetic field strength measurements comprises magnetic field strength measurements stored in response to a threshold period of time having elapsed during which no magnetic field strength measurement has been stored; and
the selected parking space profile is used to determine when the plurality of magnetic field strength measurements are made.

19. The system of claim 11, wherein the parking space sensor device is further configured to transmit an indication that the parking space is occupied by the vehicle in response to determining that the vehicle is parked proximate to the parking space sensor device based on the magnetic field strength measurement in relation to the selected magnetic field strength window.

* * * * *